United States Patent
Lange et al.

(10) Patent No.: US 6,204,119 B1
(45) Date of Patent: Mar. 20, 2001

(54) MANUFACTURING METHOD FOR A CAPACITOR IN AN INTEGRATED MEMORY CIRCUIT

(75) Inventors: Gerrit Lange; Martin Franosch, both of München; Wolfgang Hönlein, Unterhaching; Volker Lehmann, München; Hans Reisinger, Grünwald; Herbert Schäfer, Höhenkirchen-Sieg.Brunn; Reinhard Stengl, Stadtbergen; Hermann Wendt, Grasbrunn, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/312,572

(22) Filed: May 14, 1999

(30) Foreign Application Priority Data

May 14, 1998 (DE) .............................. 198 21 777

(51) Int. Cl.[7] ..................... H01L 21/8242; H01L 21/20
(52) U.S. Cl. ........................ 438/254; 438/396; 438/970
(58) Field of Search .................................. 438/254, 396, 438/970

(56) References Cited

U.S. PATENT DOCUMENTS

| | | | |
|---|---|---|---|
| 5,155,657 | * 10/1992 | Oehrlein et al. | 361/313 |
| 5,817,553 | * 10/1998 | Stengl et al. | 438/253 |
| 5,851,897 | * 10/1998 | Wu | 438/397 |
| 5,909,621 | * 6/1999 | Hsia et al. | 438/254 |

FOREIGN PATENT DOCUMENTS

| | | | |
|---|---|---|---|
| 0415530B1 | 11/1994 | (EP) . | |
| 0779656A2 | 6/1997 | (EP) . | |
| 2285338A | * 7/1995 | (GB) | 27/108 |

OTHER PUBLICATIONS

"Journal of the Electrochemical Society", vol. 137, No. 11, Nov. 1990.

* cited by examiner

Primary Examiner—John F. Niebling
Assistant Examiner—Jennifer M. Kennedy
(74) Attorney, Agent, or Firm—Herbert L. Lerner; Laurence A. Greenberg; Werner H. Stemer

(57) ABSTRACT

A manufacturing method for a capacitor in an integrated memory circuit includes initially depositing a first conducting layer and an auxiliary layer acting as an etch-stop onto a carrier. Then a layer sequence which contains alternating layers of the first material and a second material is produced on top of the first conducting layer and the auxiliary layer. The layer sequence may, in particular, have $p^+/p^-$ silicon layers or silicon/germanium layers. A layer structure with a base of a capacitor to be produced is formed from the layer sequence. Sides of the layer structure are provided with a conducting supporting structure. An opening is formed inside the layer structure, all the way down to the auxiliary layer and then the auxiliary layer and the layers made of the second material are removed. A free surface of the layers made of the first material and the supporting structure are provided with a capacitor dielectric onto which a counter electrode is applied.

10 Claims, 5 Drawing Sheets

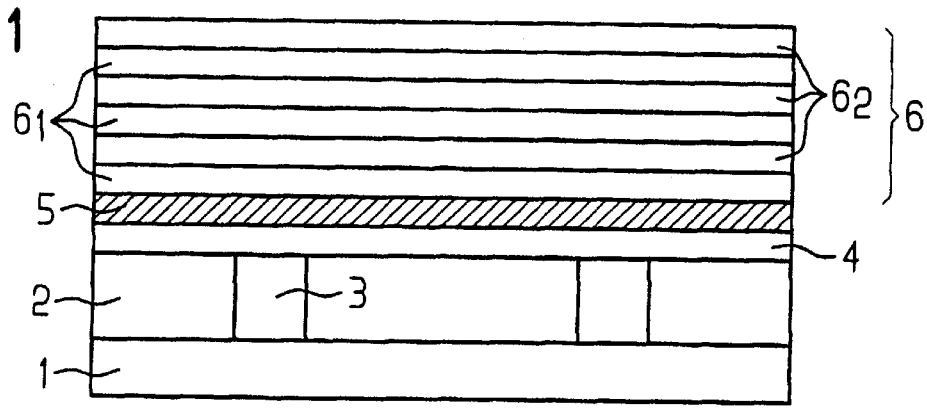
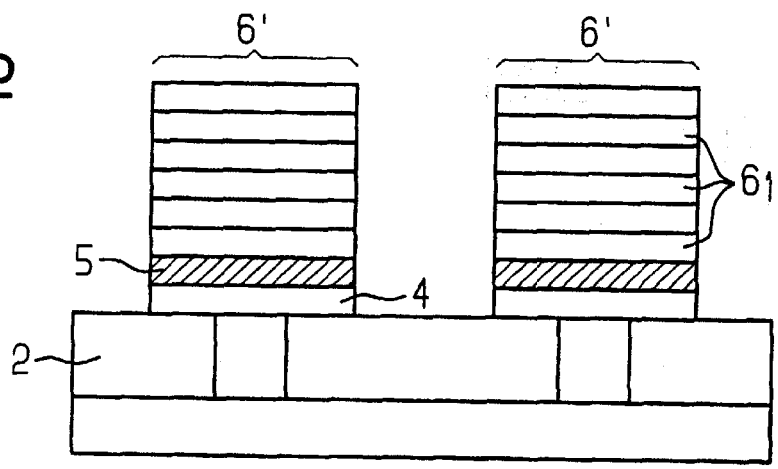
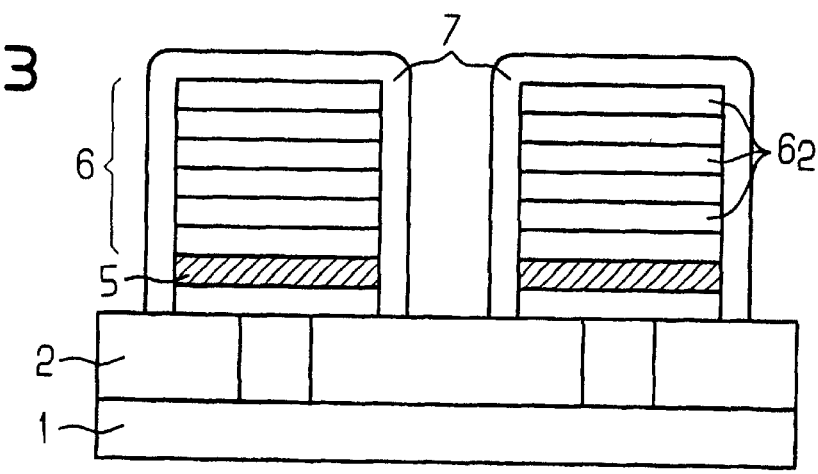

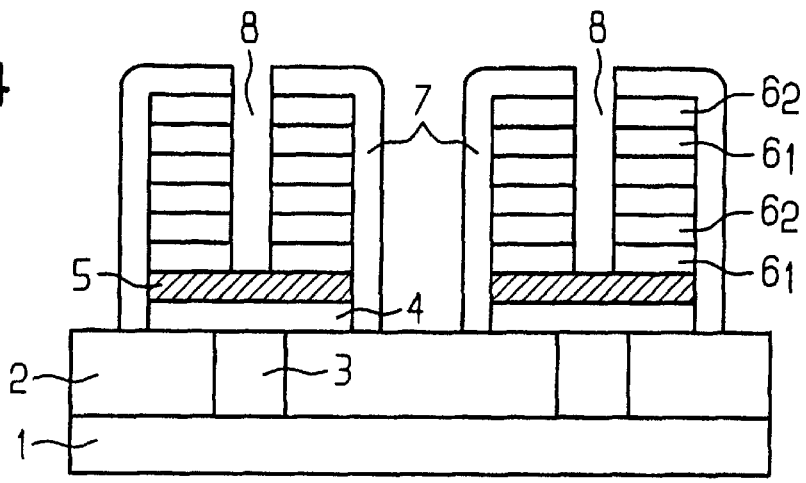
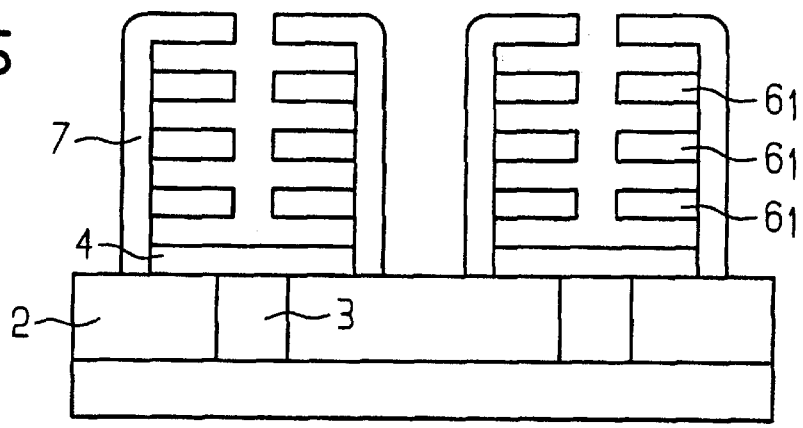
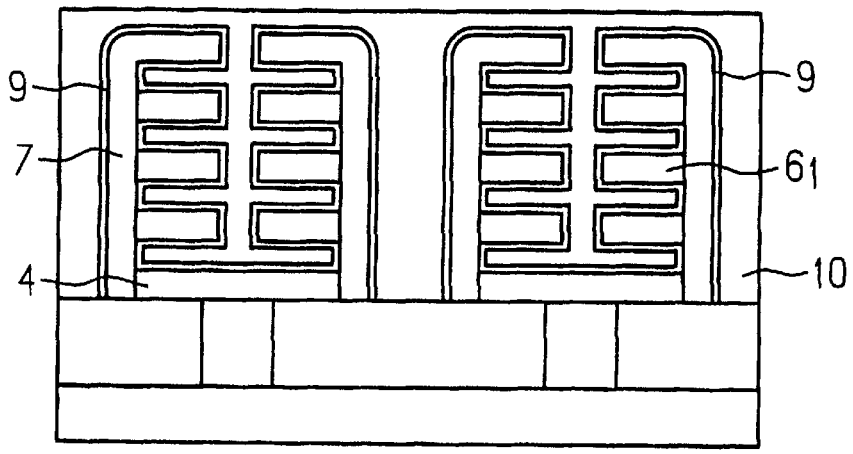

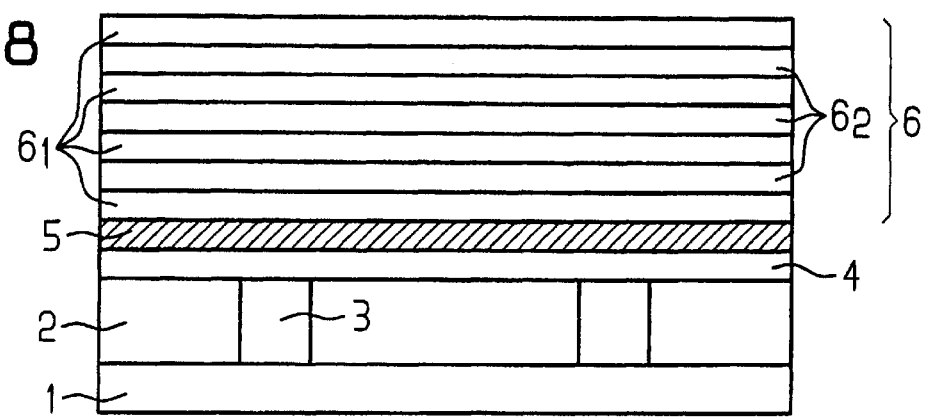
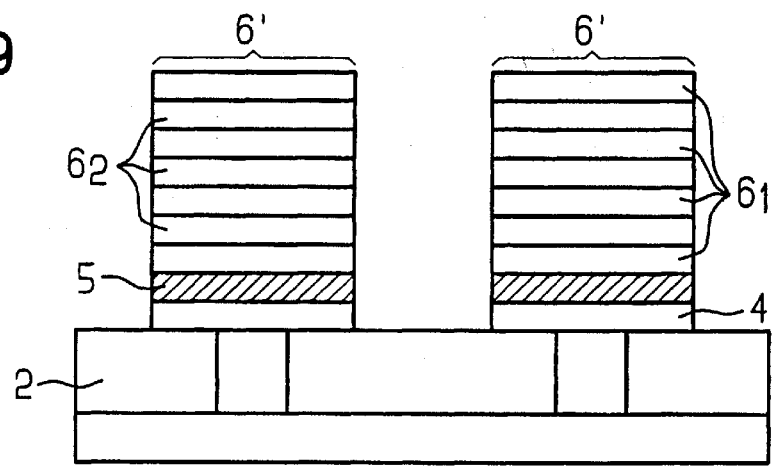
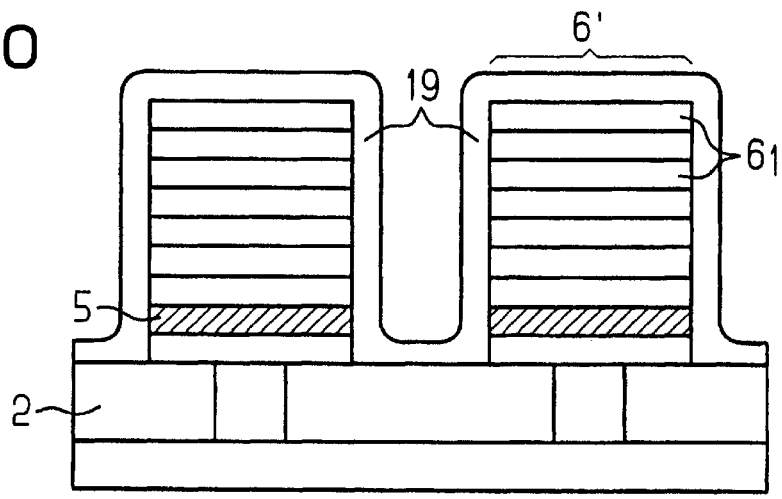

MANUFACTURING METHOD FOR A CAPACITOR IN AN INTEGRATED MEMORY CIRCUIT

BACKGROUND OF THE INVENTION

Field of the Invention

The invention relates to a manufacturing method for a capacitor in an integrated memory circuit.

Capacitors are needed in a number of integrated semiconductor circuits, for example in DRAM circuits or A/D converters. In many cases, the problem arises to realize a high capacitance sufficient for requirements with a minimum space being occupied. That problem is especially severe in DRAM circuits in which each memory cell has a memory capacitor and a selection transistor, while the space available for a memory cell is being continuously reduced. At the same time, the memory capacitors must retain a certain minimum capacitance for reliable storage of the charge and distinguish ability of the information to be read. That minimum capacitance is considered to be 25 fF at the present time.

In order to realize maximum capacitance of the memory capacitor with a given space requirement, among others, trench capacitors are known in which capacitor electrodes are disposed along side walls of a trench located in the substrate.

Another cell concept is the so-called stacked capacitor cell in which the capacitor is disposed as a stacked capacitor above the corresponding selection transistor and mostly also above the bit line. As a result thereof, the entire base area of the cell can be utilized for the capacitor and merely sufficient insulation to the neighboring memory capacitor needs to be ensured. That concept has the advantage of being highly compatible with a logic process.

A memory cell configuration with a stacked capacitor is known from European Patent 0 415 530 B1. The stacked capacitor includes a polysilicon structure with several polysilicon layers disposed essentially parallel on top of one another and connected to one another with a side support. Those layers, which are disposed in the manner of radiator ribs, lead to a significant enlargement of the surface of the polysilicon structure in comparison to the projection of the polysilicon structure onto the substrate surface. The polysilicon structure is formed by alternating deposition of polysilicon layers and selectively etchable silicon oxide or carbon layers on the surface of the substrate, structuring of those layers, producing side coverage (spacers made of polysilicon) on at least one side of the layer structure and selective etching of the silicon oxide or carbon layers. The polysilicon structures are doped with arsenic. Then, a silicon oxide as a capacitor dielectric is formed by thermal oxidation deposited on a cell plate made of doped polysilicon.

Another manufacturing method for such a multilayer stacking capacitor (called a fin-stacked capacitor) is described in European Patent Application EP 0 779 656 A2. A layer structure of alternating $p^+/p^-$-doped silicon layers is produced. Each layer structure is divided into two separate partial areas by etching an opening all the way to the underlying substrate and a capacitor is formed from each partial area, which then has a supporting structure on three sides.

SUMMARY OF THE INVENTION

It is accordingly an object of the invention to provide a manufacturing method for a capacitor in an integrated memory circuit, especially in a DRAM circuit, which overcomes the hereinafore-mentioned disadvantages of the heretofore-known methods of this general type, which can be performed easily and which is distinguished by high process reliability.

With the foregoing and other objects in view there is provided, in accordance with the invention, a manufacturing method for a capacitor in an integrated memory circuit, which comprises initially forming a first layer formed of a conducting first material and an auxiliary layer acting as an etch-stop, on a carrier which may contain an insulation layer with a connection embedded therein. Then, a sequence of layers is produced on the auxiliary layer. The sequence is formed alternatingly of a layer of the first material and a layer of a second material. The second material can be selectively etched with respect to the first material. The sequence of layers, the auxiliary layer and the first layer are structured all the way to the carrier so that a layer structure with sides is formed. A supporting structure is produced on these sides, which reach all the way down to the carrier, from a conducting material which covers the sides. Then, an opening is formed which extends through the sequence of layers inside the layer structure, with the aid of anisotropic etching that is selective with respect to the auxiliary layer. The auxiliary layer and the layers of the second material are removed with selective etching to the first material and to the supporting structure. Different etching processes can be used for the different materials in any arbitrary sequence. The layers can be removed in a single etching process with proper selection of the auxiliary layer and of the second material. In each case, etching processes with an isotropic component are used, so that only the layers of the first material and the supporting structure remain and form the first capacitor electrode. The free-lying surfaces of the layers made of the first material and the supporting structure are provided with a capacitor dielectric. A second electrode is formed on the surface of the capacitor dielectric.

High stability is ensured when etching the second material and the auxiliary layer by etching the opening inside the layer structure, because the supporting structure is formed on all of the outer sides of the layer structure. The layers made of the first material can therefore be very thin, for example, 20 to 50 nm.

The auxiliary layer makes it possible to produce an opening in the inner layer structure and simultaneously have very high process reliability because it provides a reliable etch-stop above or on the first conducting layer. Without the auxiliary layer, there is a danger of etching through the first conducting layer in the region of the opening. Since this opening, in general, covers the contact hole entirely or partially (as a connection of the first capacitor electrode), removal of the first layer would lead to a lack of or to a very poor connection of the first capacitor electrode. In other applications, etching of or etching through the first conducting layer can lead to worsened electrical properties or to damage of the structures lying underneath.

The etching process used for the production of the opening should be merely anisotropic and have sufficient selectivity with respect to the auxiliary layer. The etch rates of the first and second material do not have to be the same, since the supporting structure does not have to be etched uniformly with the layer structure.

The layers of the first material and the supporting structure can be formed from $p^+$-doped silicon with a dopant concentration $>10^{20}$ cm$^{-3}$ and the layers of the second material can be formed from $p^-$-doped silicon with a dopant concentration <$10^{19}$ cm$^{-3}$. It is known from an article by H. Seidel et al., in the Journal of the Electrochemical Society, Volume 137 (1990), page 3626 ff. that p-doped silicon can be etched selectively with respect to p$^+$-doped silicon. Etch rate differences up to a factor of 1000 are achieved between silicon with a boron doping of >$10^{20}$ cm$^{-3}$ and silicon with a boron doping of <$10^{19}$ cm$^{-3}$.

p$^+$-Doped silicon and p$^-$-doped silicon can be deposited in the same reactor, as a result of which the sequence of layers can be realized without changing the installation, by merely switching the process parameters. This results in a significant simplification of the process.

In accordance with another mode of the invention, the layers of the first material may be doped silicon, and the layers of the second material may be a germanium-containing material, for example pure germanium or germanium and silicon. When the layers are formed from germanium and silicon, the germanium content is preferably between 10% and 100%. The silicon content lies between 0% and 90%. The germanium-containing layers can be deposited doped or undoped.

The above-mentioned germanium-containing layers can be etched by a wet chemical method with good selectivity to silicon. When using an etching mixture which contains HF, $H_2O_2$ and $CH_3COOH$, the selectivity of the etching to silicon is from 1:30 to 1:1000. In this etching, the selectivity to silicon oxide and silicon nitride is about 1:30 to 1:1000.

The silicon layers can be etched selectively with respect to the germanium by using choline.

Since the diffusion coefficients of germanium in silicon and of silicon in germanium are extremely low, the layer sequence remains unchanged, even at the high temperatures required by the process, for example 800° C. At a process temperature of 1000° C., the diffusion coefficients lie at about 1.5×10$^{-6}$ cm$^2$/sec.

Preferably, the layers made from doped silicon are formed in a CVD process using silane as a process gas in a temperature range between 400 and 600° C. at a pressure between 10 and 400 torr and a silane flow rate of 30 to 300 sccm with deposition rates of 10 to 100 nm per minute. The germanium-containing layers are preferably produced by CVD deposition using germane or germane and disilane in the process gas at a temperature between 400 and 600° C. and at a pressure between 10 and 400 torr, where the germane flow rate and optionally the disilane flow rate can be adjusted to be between 30 and 300 sccm and the deposition rate lies between 10 and 100 nm per minute.

The doped silicon layers are preferably deposited by being doped in situ. For this purpose, a doping gas, for example arsine, phosphine or diborane are introduced during deposition. The layers of doped silicon and the supporting structure may be formed either from n-doped or p-doped silicon.

Layers containing doped silicon and germanium can be deposited in the same reactor. As a result of this, the sequence of layers can be produced without changing the installation, by merely switching the process parameters.

In applications in which the supporting structure and the layers of doped silicon, that is the first capacitor electrode, are to be connected electrically with an area in the substrate, it is advantageous to select the doping of the supporting structure and the doping of the doped silicon corresponding to the doping of the substrate area in order to avoid the formation of a pn junction. The first capacitor electrode can be connected directly to the substrate area without having to form another conducting material between these structures.

The layers of doped silicon can be polycrystalline, crystalline or amorphous.

In accordance with a concomitant mode of the invention, the supporting structure of doped silicon can be formed by selective epitaxy of doped silicon or by in-situ doped deposition and anisotropic back-etching of a doped polysilicon layer. Both alternatives can be carried out in the temperature range below 900° C. so that even in the case of a layer sequence of p$^+$/p$^-$-silicon, diffusion of the layers into one another is avoided. In both cases, a supporting structure is formed with defined surfaces at the ends of the layer structure. As a result of this, it is ensured that the layers of the second material can be etched out uniformly between the layers made of the first material. In this way, it is prevented that layers of the second material are not etched out locally and, at the same time, in other places, the supporting surfaces are attacked to such an extent that the individual layers of the first material fall down.

In order to increase the integration density, the opening is preferably produced with a diameter having a minimum structure size F. The layer structure has a minimum diameter or a minimum side length of F+⅔ a (a=accuracy of adjusting the mask being used), so that the opening lies within the layer structure, even in the case of maximum misadjustment. The minimum distance between neighboring layer structures is F and the minimum distance between neighboring capacitors is smaller by twice the thickness of the supporting structure.

In the manufacture of the capacitor as a memory capacitor for a dynamic memory cell configuration, the capacitor is produced as a stack capacitor. In this case, the substrate is a semiconductor substrate with selection transistors, bit lines, word lines and an insulating layer onto the surface of which the sequence of layers will be deposited. Preferably, the insulating layer is planarized, for example by chemical-mechanical polishing, so that the layer sequence is produced on an essentially planar surface.

Other features which are considered as characteristic for the invention are set forth in the appended claims.

Although the invention is illustrated and described herein as embodied in a manufacturing method for a capacitor in an integrated memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 7 are diagrammatic, cross-sectional views through a substrate on which a first embodiment of a process is realized with the aid of DRAM memory cell; and FIGS. 8 to 13 are cross-sectional views correspondingly illustrating a second embodiment.

DESCRIPTION OF THE PREFERRED EMBODIMENTS

Figure 7:
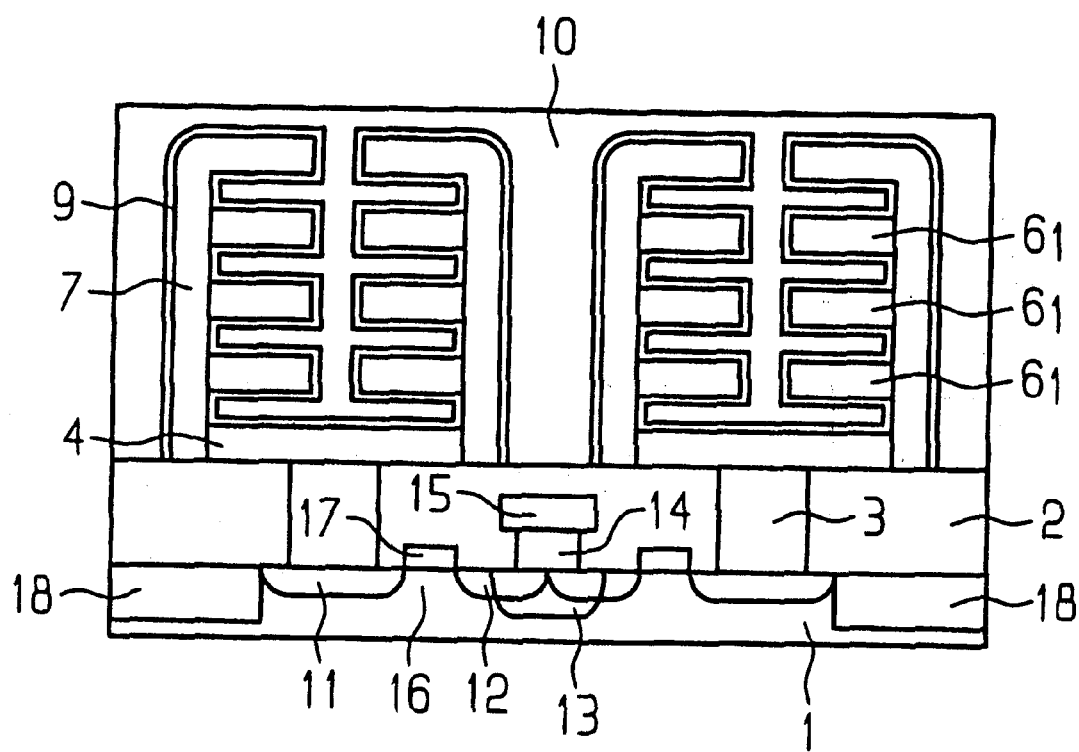

Referring now to the figures of the drawings in detail and first, particularly, to FIG. 1 thereof, there is seen an insulating layer 2 which is applied onto a substrate 1. The substrate 1 is, for example, a semiconductor substrate, especially a monocrystalline silicon chip, which includes selection transistors with word lines and bit lines. The insulating layer is formed, for example, from silicon oxide and is planarized. Contact holes 3 are opened in the insulating layer 2 and filled with electrically conducting material, for example with doped polysilicon, tungsten, tantalum, titanium, titanium nitride or tungsten silicide. The contact holes 3 are disposed in such a way that they reach all the way to a source/drain region of a selection transistor in the substrate 1 (see FIG. 7). A first layer 4 made of a first conducting material is deposited on the surface of the insulating layer 2, for example by using $p^+$-doped polysilicon with a dopant concentration of about $5 \times 10^{20}$ $cm^{-3}$ in a layer thickness of 20 nm. Then an auxiliary layer 5 acting as an etch-stop, for example made of TEOS, is formed with a layer thickness of 50 nm. Then, a sequence of layers 6 is produced on the auxiliary layer 5. The sequence of layers 6 is formed alternatingly of a layer $6_1$ made of a first material and a layer $6_2$ made of a second material. The second material is, for example, $p^-$-doped polysilicon with a dopant concentration of $1 \times 10^{19}$ $cm^{-3}$ and a layer thickness of 20 nm. Alternatively, the first layer 4 and the layer $6_1$ may be made of the first material, doped silicon layers, and the layer $6_2$ can be made from the second material, a germanium-containing layer. The layers of doped silicon 4 and $6_1$ can then be either $p^+$- or $n^+$-doped and have a dopant concentration of $5 \times 10^{20}$ $cm^{-3}$, for example. The layers of doped silicon 4 and $6_1$ and the germanium-containing layer $6_2$ are applied in a layer thickness of 20 nm, for example, by CVD deposition using silane or germane or germane and disilane at a temperature between 400° C. and 600° C. and at a pressure between 10 and 400 torr. The gas flow is between 30 and 300 sccm and the deposition rate lies between 10 and 100 nm/minute.

The lowermost layer of the layer sequence, which lies on the auxiliary layer 5, is formed of the first material. The uppermost layer of the layer sequence is made of the second material.

According to FIG. 2, layer structures 6' are then formed from the layer sequence 6, by using anisotropic etching with a mask. The surface of the insulating layer 2 is free between the layer structures 6'. The anisotropic etching can be carried out with $CF_4$ and $SF_6$ for the layer sequence in both examples explained above.

As is shown in FIG. 3, a supporting structure 7 is then formed, using selective epitaxy of silicon. The selective epitaxy is carried out in a process using $SiCl_2H_2$, HCl, $H_2$ and a doping gas, for example $B_2H_6$ or $PH_3$ as a process gas in a temperature range between 700° C. and 900° C. If the layer sequence is formed of $p^+/p^-$-silicon, a temperature up to a maximum of 750° C. is chosen in order to prevent diffusion of the layers into one another. In selective epitaxy, the supporting structure 7 grows on the surface of the layer structure 6', doped in-situ. The supporting structure 7 covers the sides and the surface of the layer structure 6' completely. No silicon grows on the surface of the insulating layer 2.

Next, according to FIG. 4, an opening 8 is etched in the layer structure 6' with the covering supporting structure 7 by using a photomask, so that a surface of the layer sequence 6 is free in the area of the opening. The etching process is anisotropic and selective with respect to the auxiliary layer and HBr and chlorine can be used as etching gases (for both examples of the layer sequence). The opening is preferably centered in the layer structure.

FIG. 5 shows that the remaining parts of the layers $6_2$ made of the second material are removed by selective etching with respect to the doped silicon and the insulating layer 2. In the case of the $p^-$-doped silicon layer $6_2$, the selective etching can be carried out, for example, in an alkaline etching solution, which contains ethylenediamine, pyrocatechol, pyrazine and water. Preferably, the concentration of the solution lies in the following region: 1l of ethylenediamine, 160 g of pyrocatechol, 6 g of pyrazine and 133 ml of water. Moreover, KOH can also be used as an etching solution at concentrations in the range of 10 to 50 weight %. With respect to $p^+$-doped polysilicon and $p^-$-doped polysilicon, this etching shows a selectivity of at least 1:500. In the case of the germanium-containing layers $6_2$, the etching is performed, for example, by wet chemistry using an etching mixture which contains HF, $H_2O_2$ and $CH_3COOH$. The concentration of the solution preferably lies in the following range: 1 part of HF, 200 parts of $H_2O_2$, 300 parts of $CH_3COOH$. With respect to doped polysilicon, this etching shows a selectivity of from 1:30 to 1:1000. With respect to silicon oxide and silicon nitride, it has a selectivity of from 1:30 to 1:1000.

The layers made of the first material and the supporting structure 7, which are not attacked by the selective etching, are connected to one another mechanically and electrically.

According to FIG. 6, the surface of the layers made of doped silicon $6_1$ and the supporting structure 7 is provided with a capacitor dielectric 9. The capacitor dielectric 9 is formed, for example, from a post-oxidized silicon nitride layer. Finally, a counter electrode 10 is formed by deposition of an in-situ doped polysilicon layer. The counter electrode 10 may be formed of a $p^+$-doped or $n^+$-doped polysilicon layer (doping is always $5 \times 10^{20}$ $cm^{-3}$, for example) or of a germanium-containing layer, independently of the material of the first electrode.

FIG. 7 is a cross-sectional view, in which selection transistors are indicated in the substrate 1. The layers of doped silicon $6_1$ and the connected supporting structure 7 form a first electrode (memory nodes) for a memory capacitor. This first electrode is connected to a source/drain region 11 of a selection transistor through the contact 3 disposed underneath it. Another source/drain region of the selection transistor is connected with a corresponding source/drain region 12 of a neighboring selection transistor through a connecting region 13. Furthermore, the connecting regions 13 are connected through a trenched bit line contact 14 to a trenched bit line 15. The trenched bit line 15 and the bit line contact 14 are surrounded by the insulating layer 2. A channel region 16 is located between the source/drain regions 11 and 12 of a selection transistor, as well as a non-illustrated gate dielectric and a gate electrode which acts on a word line 17. The word line 17 and the bit line contact 14 are each formed from doped polysilicon. The bit line 15 is formed from doped polysilicon, tungsten silicide or tungsten. An insulation structure, for example a flat trench 18, is disposed on a side of the source/drain region 11 facing away from the bit line 15. The flat trench 18 is filled with insulating material (shallow trench insulation) to produce insulation between the neighboring selection transistor pairs.

A second embodiment example of the invention differs from the first embodiment example with respect to the method of production of the supporting structure and related measures. The same reference numerals are used as in the first embodiment example illustrated in FIGS. 1 to 7. Only differences from the first embodiment example are explained in detail below.

As before, FIG. 8 shows a first layer 4, an auxiliary layer 5 and a layer sequence 6 produced on an insulating layer 2. The uppermost layer is a layer made of the first material $6_1$.

According to FIG. 9, the layer sequence 6, the auxiliary layer 5 and the first layer 4 are structured to form a layer structure 6' as in the first embodiment example.

Then, according to FIG. 10, a doped polycrystalline silicon layer 19 is deposited by using in-situ doped CVD deposition. The doped polycrystalline silicon layer 19 has a thickness of, for example, 30 to 50 nm. The doped polycrystalline silicon layer 19 is of the same conductivity type as the layers made from the first material $6_1$ and it has an essentially conforming edge cover.

Figure 11:
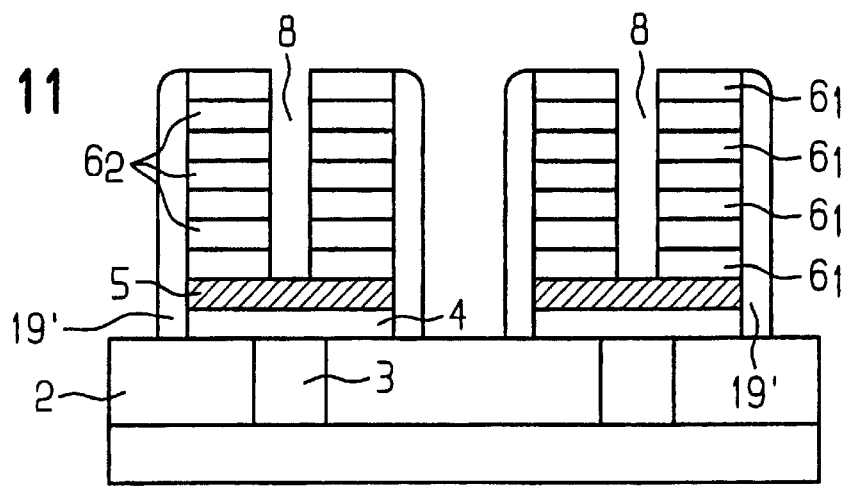

FIG. 11 shows that by using anisotropic back-etching with, for example, $CF_4$ and $SF_6$, supporting structures 19' are formed from the doped polycrystalline silicon layer 19. The supporting structures 19' cover the edges of the layer structure 6' as spacers. In the formation of the supporting structures 19', the surface of the insulating layer 2 is freed outside the supporting structures 19' and the layer structure 6'. As in the first embodiment example, an opening 8 is formed in the layer structure, preferably centered, reaching all the way to the auxiliary layer 5.

Figure 12:
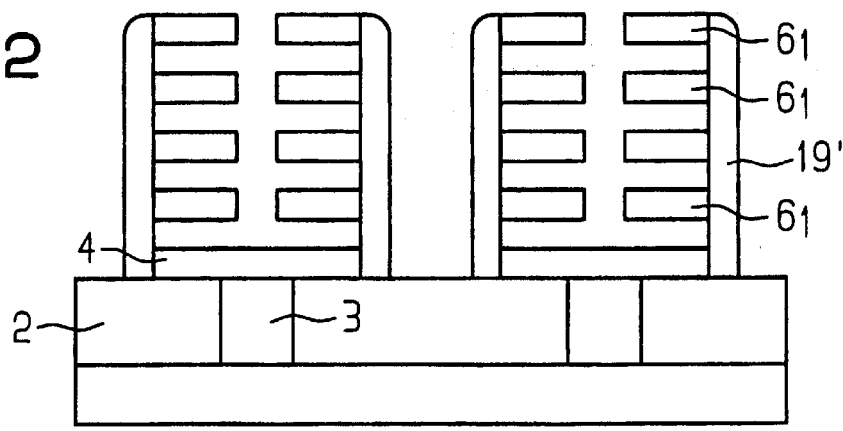
Figure 13:
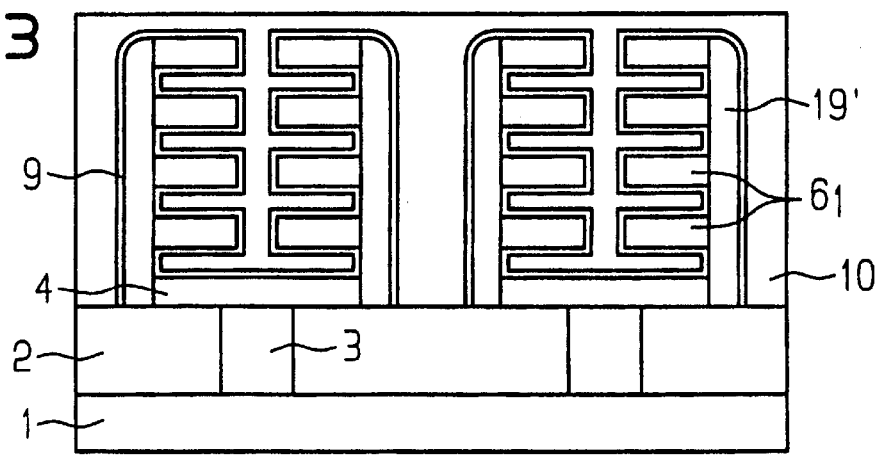

FIGS. 12 and 13 show that, as in the first embodiment example, the auxiliary layer 5 and the layers made from the second material are etched out. The capacitor is completed by the formation of a dielectric 9 and a counter electrode 10.

We claim:

1. A method for manufacturing a capacitor in an integrated memory circuit, which comprises the following process step sequence:

applying a first layer made of a conducting first material onto a carrier and an auxiliary layer acting as etch-stop onto said first layer;

producing a layer sequence on the auxiliary layer by alternating a layer made of the first material and a layer made of a second material;

structuring the layer sequence, the auxiliary layer and the first layer to the carrier to form a layer structure with sides;

forming a supporting structure from a conducting material covering the sides of the layer structure and reaching said carrier;

forming an opening inside the layer structure extending entirely through the layer sequence after said forming-a-supporting-structure step;

selectively removing the auxiliary layer and the layers made of the second material, defining free surfaces of the layers made from the first material and the supporting structure inside the layer structure;

producing a capacitor dielectric on the free surfaces of the layers made from the first material and the supporting structure, the capacitor dielectric having a surface; and producing a counter electrode on the surface of the capacitor dielectric.

2. The manufacturing method according to claim 1, wherein the first material is doped silicon and the second material contains germanium.

3. The manufacturing method according to claim 1, wherein the first material is $p^+$-doped polysilicon and the second material is $p^-$-doped polysilicon.

4. The manufacturing method according to claim 1, wherein the first material is $p^+$-doped polysilicon and the second material is undoped polysilicon.

5. The manufacturing method according to claim 1, which comprises forming the auxiliary layer of silicon oxide.

6. The manufacturing method according to claim 1, which comprises forming the auxiliary layer of silicon nitride.

7. The manufacturing method according to claim 1, which comprises forming the supporting structure from the first material.

8. The manufacturing method according to claim 1, which comprises forming the supporting structure by selective epitaxy of doped silicon.

9. The manufacturing method according to claim 1, which comprises forming the supporting structure by in-situ doped deposition and anisotropic back-etching of a doped polysilicon layer.

10. The manufacturing method according to claim 2, wherein the germanium-containing layers have a germanium content between 10 and 100 mole % and a silicon content between 0 and 90 mole %.

* * * * *